United States Patent [19]

Kasahara

[11] Patent Number: 4,829,357
[45] Date of Patent: May 9, 1989

[54] PNPN THYRISTOR

[75] Inventor: Kenichi Kasahara, Tokyo, Japan

[73] Assignee: NEC Corporation, Tokyo, Japan

[21] Appl. No.: 136,588

[22] Filed: Dec. 22, 1987

[30] Foreign Application Priority Data

Dec. 22, 1986 [JP] Japan .................. 61-307033
Jan. 20, 1987 [JP] Japan .................. 62-10815

[51] Int. Cl.[4] .............................. H01L 29/74
[52] U.S. Cl. ....................... 357/38; 357/16; 357/17; 372/50
[58] Field of Search ............... 357/16, 17, 38; 372/50

[56] References Cited

U.S. PATENT DOCUMENTS 4,438,446  3/1984  Tsang ................. 357/17
4,512,022  4/1985  Tsang ................. 357/17
4,658,402  4/1987  Kobayashi ........... 372/50

OTHER PUBLICATIONS

T. Terakado et al., The Institute of Electronics, Information and Communication Engineers, 1985, "Light Amplification Using Bistable Laser Diode", p. 886.
Taylor et al, "A New Double Heterostructure ... Epitaxy", J. Appl. Phys., 59(2), Jan. 15, 1986, pp. 596-600.

Primary Examiner—Joseph E. Clawson, Jr.
Attorney, Agent, or Firm—Sughrue, Mion, Zinn, Macpeak & Seas

[57] ABSTRACT

A pnpn thyristor comprises an anode and cathode region, and a base region which is positioned between the anode and cathode regions. The base region is composed of a p-base layer facing the cathode region, and a first to third n-base layers. Among the first to third n-base layers, the first n-base layer faces the p-base layer, and the third n-base layer faces the anode region. The anode and cathode regions are wider in their forbidden bandwidth than the first and third n-base layers, and the second n-base layer is narrower in its forbidden bandwidth than the first and third n-base layers so that an optical coupling property is improved, and a high output of light is obtained.

10 Claims, 8 Drawing Sheets

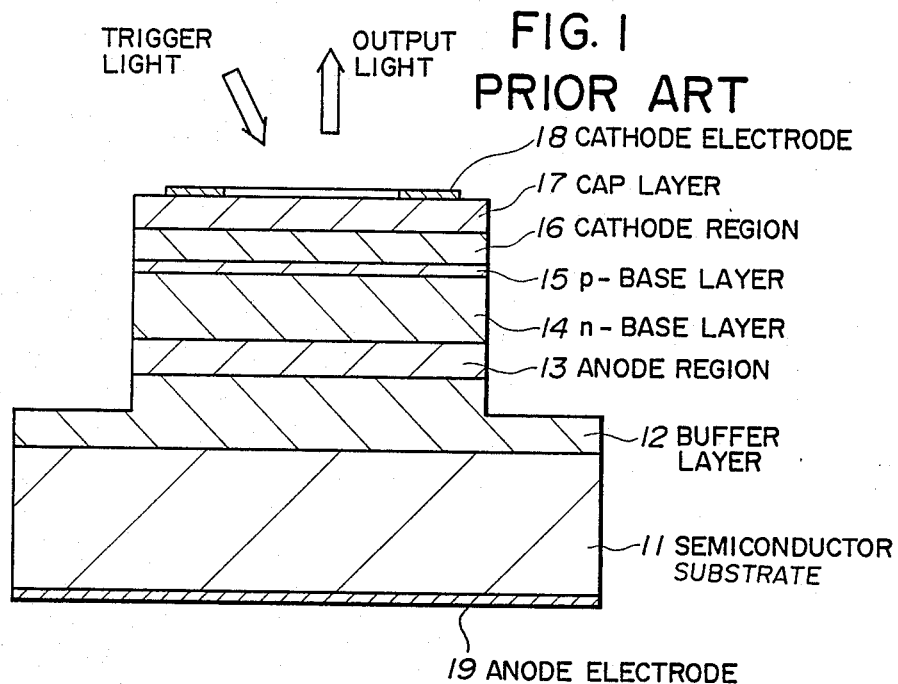
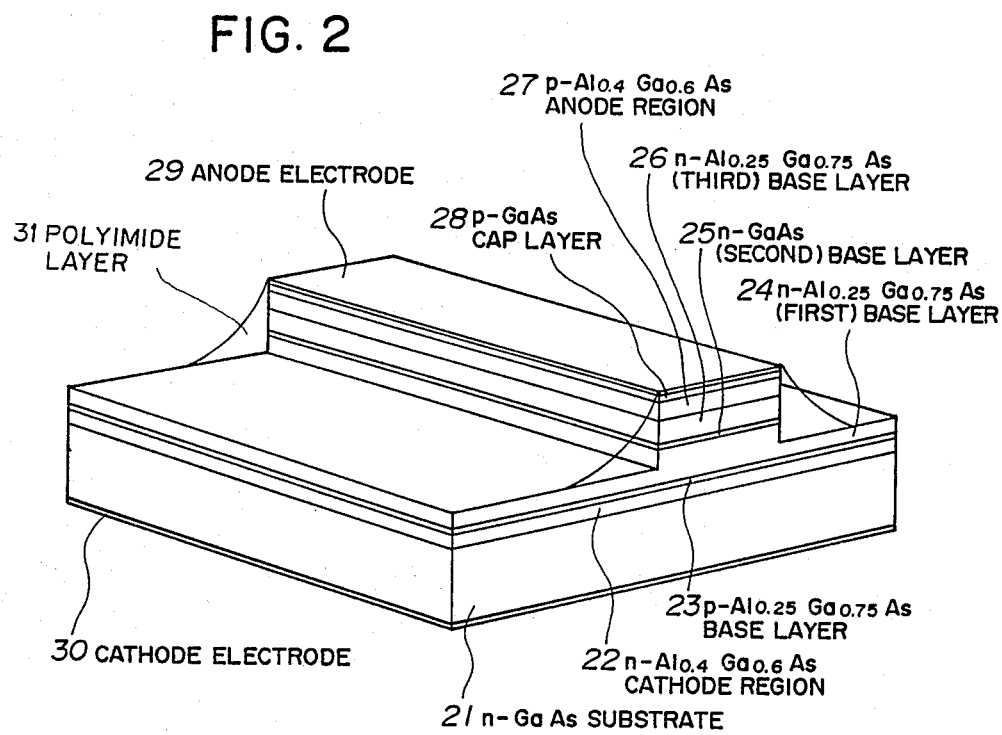

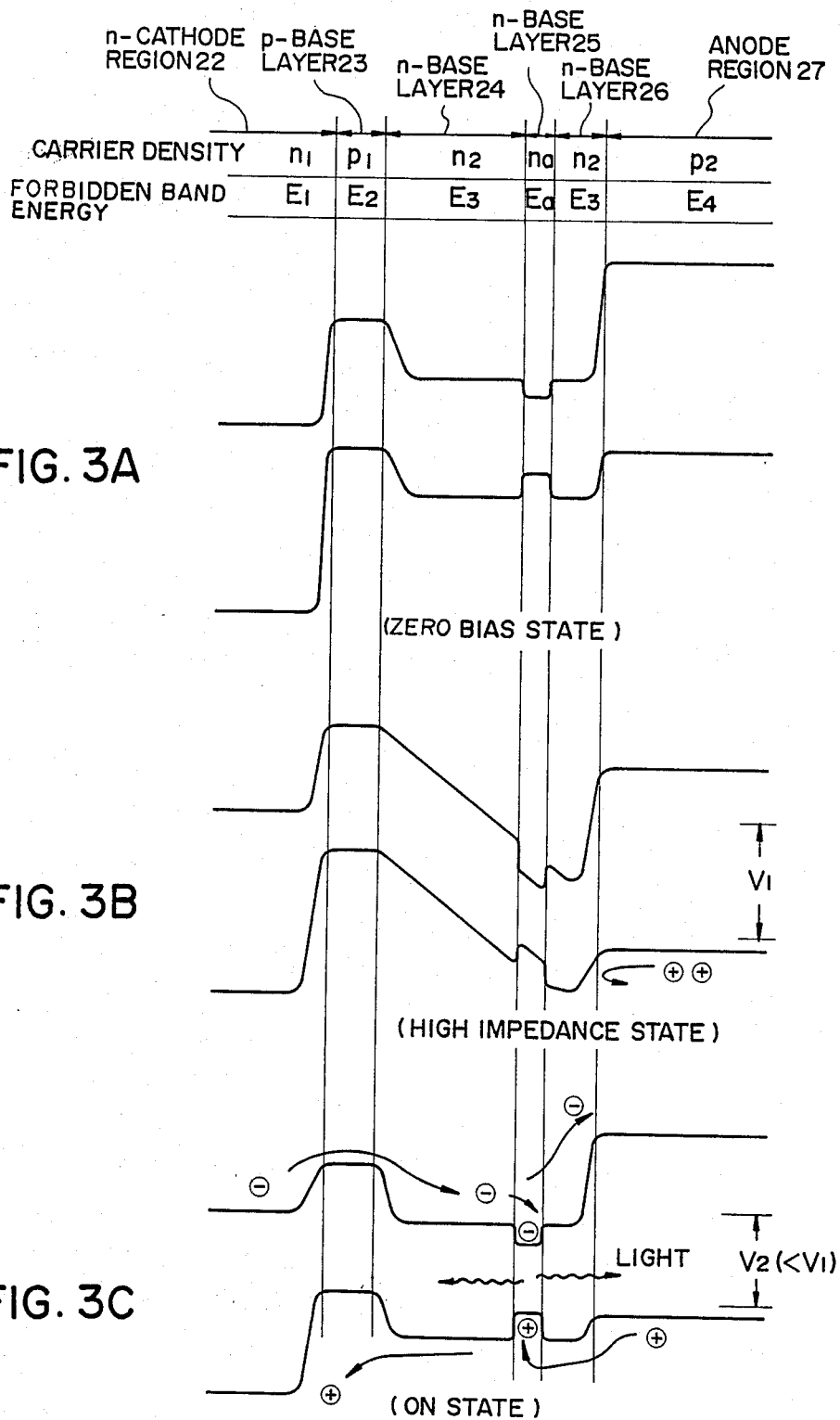
FIG. 3A (ZERO BIAS STATE)
FIG. 3B (HIGH IMPEDANCE STATE)
FIG. 3C (ON STATE)

FIG. 4
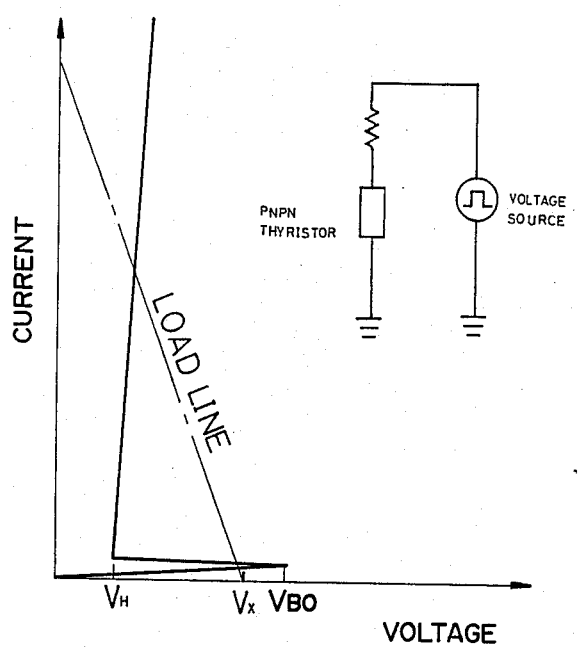
FIG. 5
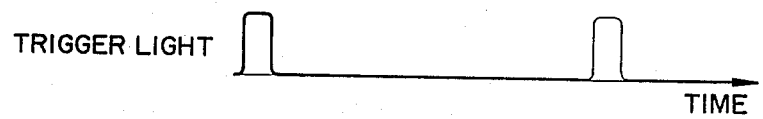
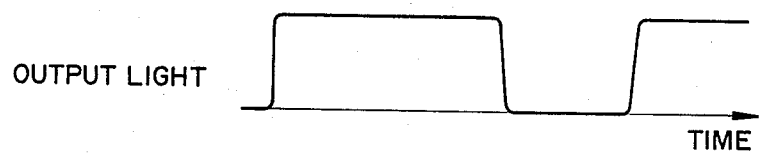
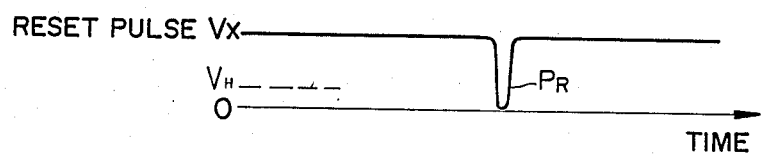

(ZERO BIAS STATE)

(HIGH IMPEDANCE STATE)

(ON STATE)

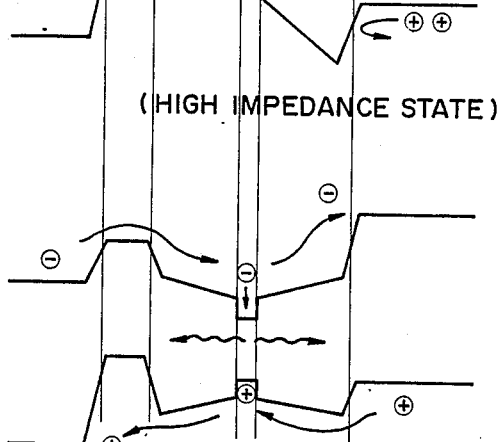
FIG. 10A (ZERO BIAS STATE)
FIG. 10B (HIGH IMPEDANCE STATE)
FIG. 10C (ON STATE)

PNPN THYRISTOR

FIELD OF THE INVENTION

The invention relates to a pnpn thyristor, and more particularly to a pnpn thyristor which is applicable to an optical semiconductor memory in an image processing system, optical computer and so on.

BACKGROUND OF THE INVENTION

A bistable semiconductor laser is described in detail on a paper of "The Institute of Electronics, Information and Communication Engineers, 1985". In the bistable semiconductor laser, light is supplied from a light emitting diode through a lens to one facet thereof to be focussed into an active layer in an unexcited state so that a laser oscillation is obtained with the trigger light.

Such a bistable semiconductor laser in which a laser oscillation is performed with a minute trigger light, and wherein the laser oscillation thus induced is continued thereafter even in the absence of the trigger light, is applicable to an optical semiconductor memory which is an important device in a prospective optical switching system, parallel optical information processing system and so on.

Conventional optical semiconductor memory is described on pages 596 to 600 of "Journal of the Applied Physics, 59(2), 15 January 1986". The optical semiconductor memory includes a pnpn thyristor to be provided with an n-base layer of n-GaAs having a narrower forbidden bandwidth between an anode region of p-AlGaAs and cathode region of n-AlGaAs. In the thyristor, a bias voltage is applied thereto to provide a turning-on thereof wherein a transition is performed from a high impedance state to a low impedance state so that carriers are injected into the n-base region to be confined therein. As a result, a spontaneous emission light is radiated from the thyristor.

In the case of the bistable semiconductor laser, however, there is a disadvantage that an optical coupling of the trigger light is difficult at the facet thereof, thereby increasing the coupling loss of the trigger light, although an induced emission light which is desirable in regard to light output power is obtained therein.

In the case of the pnpn thyristor, further, such a high output of light is not obtained as in the bistable semiconductor laser because an output light is a spontaneous emission light.

SUMMARY OF THE INVENTION

Accordingly, it is an object of the invention to provide a pnpn thyristor in which an optical coupling of trigger light is easy to be improved.

It is a further object of the invention to provide a pnpn thyristor in which a high output of light is obtained.

According to the invention, a pnpn thyristor comprises, anode and cathode regions, and a base region which is positioned between said anode and cathode regions, said base region including a p-base layer facing said cathode region, and first to third n-base layers among which said first n-base layer faces said p-base layer, and said third n-base layer faces said anode region, wherein respective forbidden bandwidths of said anode and cathode regions are wider than those of said first and third n-base layers, and a forbidden bandwidth of said second n-base layer is narrower than those of said first and third n-base layers.

BRIEF DESCRIPTION OF THE DRAWINGS

The invention will be described in more detail in conjunction with following drawings wherein, FIG. 1 is a cross sectional view showing a conventional pnpn thyristor, FIG. 2 is a perspective view showing a pnpn thyristor in a first embodiment according to the invention, FIGS. 3A to 3C are energy band diagrams showing an operation of the pnpn thyristor in the first embodiment, FIG. 4 is an explanatory diagram showing a relation between a bias voltage and current flowing in the pnpn thyristor in the first embodiment, FIG. 5 is a timing chart showing the operation of the pnpn thyristor in the first embodiment, FIGS. 10A to 10C are energy band diagrams showing an operation of the pnpn thyristor in the third embodiment.

DESCRIPTION OF PREFERRED EMBODIMENTS

Figure 6:
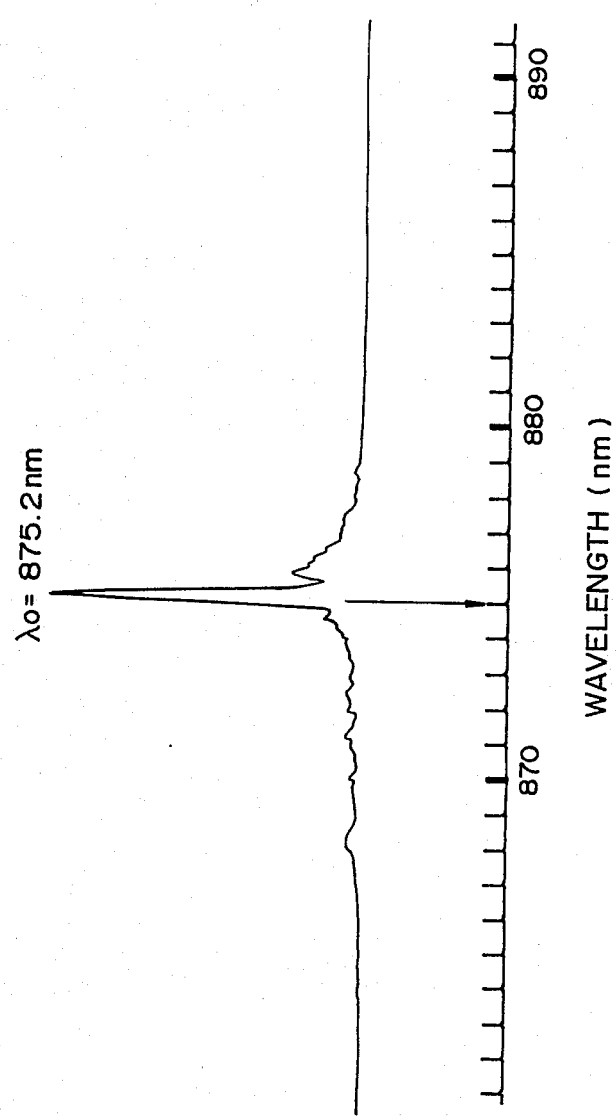
FIG. 6 is a spectrum diagram of output light in the pnpn thyristor in the first embodiment.

Before explaining a pnpn thyristor in an embodiment according to the invention, an optical semiconductor memory of a pnpn thyristor mentioned before will be again explained briefly. The optical semiconductor memory comprises a semiconductor substrate 11 of GaAs, a buffer layer 12 of GaAs, an anode region 13 of p-AlGaAs, an n-base layer 14 of n-GaAs having a narrower forbidden bandwidth, a p-base layer 15 having a thickness of 30Å, a cathode region 16 of n-AlGaAs, a cap layer 17 of GaAs, and cathode and anode electrodes 18 and 19 provided respectively on the upper surface of the cap layer 17 and back surface of the semiconductor substrate 11.

In operation, a predetermined level of a bias voltage is applied across the cathode and anode electrodes 18 and 19, and trigger light is supplied as shown by an arrow so that a transition is peformed from a high impedance state to a low impedance state whereby carriers are injected into the n-base layer 14 to be confined therein. As a result, spontaneous emission light is radiated therefrom as shown by an arrow. However, the output light is not as high in its intensity as is expected in the case of a bistable semiconductor laser.

In FIG. 2, there is shown a pnpn thyristor in the first embodiment according to the invention. The thyristor is applicable to an optical semiconductor memory for the 0.8 μm wavelength band which is composed of AlGaAs/GaAs system semiconductor. The pnpn thyristor comprises a semiconductor substrate 21 of n-GaAs, a cathode region 22 of n-Al$_{0.4}$Ga$_{0.6}$As having a thickness of 2 μm and impurity density of $5 \times 10^{17}$ cm$^{-3}$, a p-base layer 23 of p-Al$_{0.25}$Ga$_{0.75}$As having a thickness of 50Å and impurity density of $1\times10^{19}$ cm$^{-3}$, a first n-base layer 24 of undoped n-Al$_{0.25}$Ga$_{0.75}$As having a thickness of 0.3 μm and impurity density of $1\times10^{15}$ cm$^{-3}$, a second n-base layer 25 of undoped n-GaAs having a thickness of 0.1 μm and impurity density of $1\times10^{15}$ cm$^{-3}$, a third n-base layer 26 of n-Al$_{0.25}$Ga$_{0.75}$As having a thickness of 0.5 μm and impurity density of $1\times10^{17}$ cm$^{-3}$, an anode region 27 of p-Al$_{0.4}$Ga$_{0.6}$As having a thickness of 1 μm and impurity density of $5\times10^{18}$ cm$^{-3}$, a cap layer 28 of p-GaAs having a thickness of 0.2 μm and impurity of $2\times10^{19}$ cm$^{-3}$, and anode and cathode electrodes 29 and 30 provided respectively on the upper surface of the cap layer 28 and back surface of the semiconductor substrate 21. The pnpn thyristor is shaped to have a stripe configuration from the upper portion of the first n-base layer 24 to the cap layer 28 to be formed in an etching process and is provided with polyimide layers 31 on the both sides of the stripe configuration whereby the difference of refractive indices between an active layer and both sides thereof becomes smaller so that a transverse mode oscillation can be controlled. The polyimide layers 31 function also as passivation. Resonance planes are formed at cleaved facets to provide a resonator having a length of 100 μm.

In FIGS. 3A to 3C, there are shown energy band diagrams of the pnpn thyristor in which a zero bias state, high impedance state and on state thereof are shown respectively. For simplifying the illustrations thereof, such matters as a discontinuity at a heterostructure junction which are not directly related to the feature of the invention are approximately drawn. As shown at the top of FIG. 3A, forbidden band energies of the n-cathode region 22 and p-anode region 27 are $E_1$ and $E_4$ ($E_1=E_4$ in the embodiment) respectively, while a forbidden band energy Eg of the n-base layer is composed of forbidden band energies $E_3$ of the first and third base layers 24 and 26, and a forbidden band energy Ea of the second n-base layer 25. Among the first to third n-base layers 24 to 26, the second n-base layer 25 of the forbidden band energy Ea acts as an active layer for a laser oscillation. Further, a forbidden band energy of the p-base layer 23 is $E_2$.

In regard to the values of the forbidden band energies mentioned above, $E_1$ and $E_4$ are larger than $E_3$, and Ea is smaller than $E_3$, that is, $E_1$, $E_4 > E_3 >$ Ea. On the other hand, carrier densities of the n-cathode region 22, and first to third n-base layers 24 to 26 are $n_1$, $n_2$, $n_a$, and $n_2$ respectively, while those of the p-base layers 23 and p-anode region 27 are $p_1$ and $p_2$ respectively. The carrier densities $n_2$ and $n_a$ are set to be low to some extent.

In operation, a zero bias state of the pnpn thyristor is shown in FIG. 3A. A predetermined level of a bias voltage is then applied across the anode and cathode electrodes 29 and 30. At the starting stage, substantially no current flows through the pnpn thyristor due to a high impedance state shown in FIG. 3B. A depletion layer is formed to be extended into the n-base region because the n-base layers 24 to 26 are of low densities, that almost all of the voltage is applied across a p-n junction of the p and n-base layers 23 and 24. At the present stage, holes in the p-anode region 27 can not extend a potential barrier formed at a p-n junction between the p-anode region 27 and third n-base layer 26 so that a high impedance state under which substantially no current flows is obtained. When the applied voltage is further increased up to a predetermined level to be larger than a break over voltage $V_{BO}$ shown in FIG. 4, current suddenly flows to result in an on state shown in FIG. 3C, as known in the operation of a normal thyristor. The bias voltage $V_1$ can be decreased down to $V_2$ as shown in FIGS. 3B and 3C. Under the on state, the voltage applied across the thyristor is substantially equal to a voltage to be applied to a semiconductor device having a single p-n junction. The narrow forbidden bandwidth Ea (Eg=Ea) of the second n-base layer 25 is provided in the invention so that a portion of holes and electrons are dropped into a potential well. In this occasion, a laser oscillation is induced in the thyristor when a gain exceeds a loss, if a reflecting mirror is provided at the outside thereof. Electrons flowing into the anode region 27 and holes flowing into the cathode region 22 can be decreased in regard to the number thereof so that the relaxation of carriers becomes easier in the active layer of the n-base layer 25 because the forbidden bandwidths $E_1$ and $E_4$ of the n-cathode and p-anode regions 22 and 27 are wider than those $E_3$ of the n-base layers 24 and 26. As a result, the emission efficiency is increased in the thyristor. In a case where a voltage applied across the thyristor is set to be $V_X$ shown in FIG. 4, and an appropriate amount of light is supplied thereto, the light is absorbed in the n-base layers 24, 25 and 26 so that holes are injected into the p-base layer 23. The n-base layer 25 is thin and the n-base layers 24 and 26, mainly, function for absorbing layers. The holes thus injected thereinto increas the number of electrons passing through the p-base layer 23 because the transistor effect is expected therein. The electrons moderate the inclination of potential in the n-base layers 24 to 26, thereby increasing the number of holes injected from the anode region 27 into the n-base layer 26. In such a manner, a positive feedback effect is performed to shift the optical semiconductor memory from a high impedance state to an on state. As a result, a laser oscillation is induced in the thyristor to which trigger light is supplied as shown in FIG. 5. The laser oscillation is continued even after the turning-off of the trigger light, but stopped therein when an applied voltage $V_X$ is reset as shown by a reference symbol $P_R$ in FIG. 5. Reset voltage value is set to be lower than the holding voltage value $V_H$. As clearly understood from the above, the sensitivity of trigger light is increased therein as an applied voltage $V_X$ thereacross approaches the break over voltage $V_{BO}$. In the first embodiment, several tens mW of output light are obtained in the thyristor when several tens of μW of trigger light are supplied thereto. At the same time, external differential quantum efficiency is 23 percent at one facet, while a wavelength of a laser oscillation is approximately 875.2 nm wherein an induced emission light is obtained corresponding to a bandgap of GaAs. Further, a light emission is not obtained at a wavelength corresponding to a bandgap of the n-base layers 24 and 26, but an effective confinement of injected carriers is performed in the n-base layer 25 under the on state as shown in FIG. 6 wherein current flows in an amount of 190mA which is 1.2 times a current threshold of 160mA under the applied bias voltage of 1.7V at the room temperature.

If it is assumed that a single n-base layer having a thickness of approximately 0.1μm equal to that of the active layer in the first embodiment and having a small forbidden bandwidth is provided in place of the first to third n-base layers in the first embodiment, the thickness is too thin to absorb trigger light so that the sensitivity of the trigger light becomes lowered.

Figure 7:
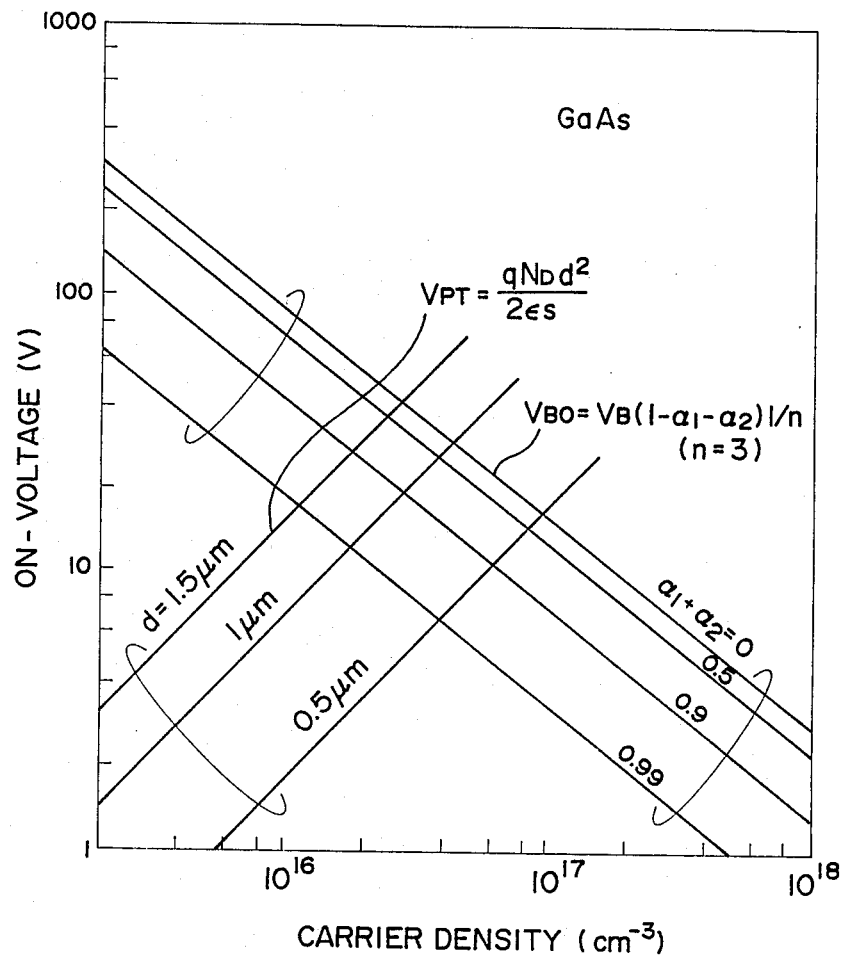
FIG. 7 is a design chart for the pnpn thyristor in the first embodiment.

In FIG. 7, there is shown a design chart by which parameters of a carrier density, layer thickness etc. in a base region of GaAs for a normal pnpn thyristor used as an electric switching means are determined. Accordingly, the design chart can be used to design a pnpn thyristor of the invention.

In a thyristor, the transition from a high impedance state to an on state is controlled dependent on a punch through voltage $V_{PT}$ of an n-base region and avalanche breakdown voltage $V_{B1}$. In a case where an n-base region of the thyristor is of a single semiconducto layer, a turning-on voltage is determined by use of a step junction approximation, as defined in the following equation (1) according to a punch through limitation, and in the following equation (2) and (3) according to an avalanche breakdown limitation.

$$V_{PT} \simeq \frac{qN_D d^2}{2\epsilon s} \quad (1)$$

$$V_{BO} = V_B(1 - \alpha_1 - \alpha_2)^{1/n} \quad (2)$$

$$V_B \simeq 60 \, (Eg/1.1)^{3/2} \, (N_D/10^{16})^{-3/4} \quad (3)$$

where q is $1.6 \times 10^{-19}$ coulomb, N is a carrier density (cm$^{-3}$) of a base layer, d is a thickness of the base layer, $\epsilon s$ is a permittivity thereof, $\alpha_1$ and $\alpha_2$ are current gains of npn and pnp transistors respectively, n is a constant, and Eg is a forbidden band energy (eV). As clearly understood from the above, a turning-on voltage is determined in regard to a carrier density in the design chart. In a case where the design chart is applied to a pnpn thyristor according to the invention, parameters are determined to be shifted in the direction of a higher voltage to some extent.

Next, there will be explained a pnpn thyristor in the second embodiment according to the invention. The pnpn thyristor is different from one in the first embodiment only in that a thickness of a p-base layer 23 in the second embodiment is smaller than that in the first embodiment such that a depletion layer is formed, for instance, even in a case where an externally applied voltage is zero.

Figure 8A:
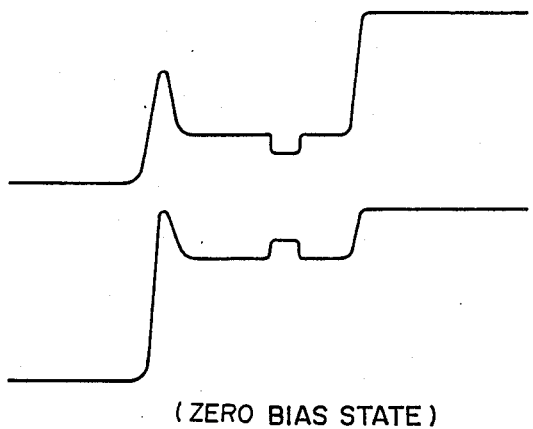
FIGS. 8A to 8C are energy band diagrams showing an operation of a pnpn thyristor in a second embodiment according to the invention.
Figure 8B:
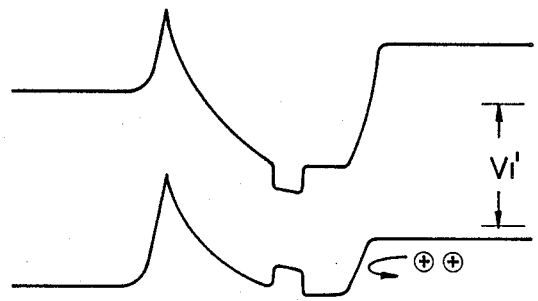
Figure 8C:
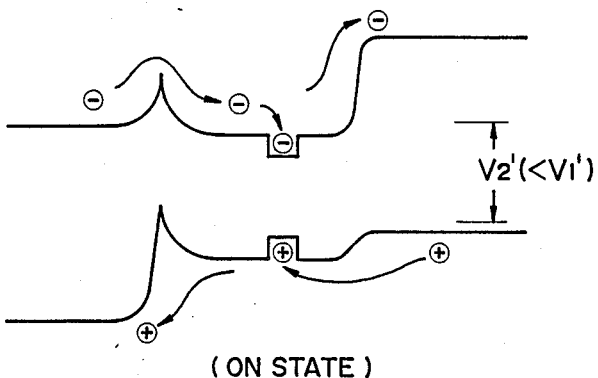

In operation, an optical current gain in a layer 23, and n-base layer 24 becomes higher so that a sensitivity of trigger light is further increased. Energy band diagrams in the second embodiment are shown in FIGS. 8A to 8C.

In "Journal of Applied Physics, 59(2), 15 January 1986" mentioned before, an optical thyristor having a thinned p-base layer is described. According to the paper, it is reported that current of more than 100 mA can be obtained in the thyristor which is turned on by applying trigger light of several $\mu$W thereto. In a case where such an amount of current flows into an active layer effectively, a laser oscillation can be completely performed. The pnpn thyristor in the second embodiment is operated based on the principle as described above. FIGS. 8A to 8C are self-explanatory in view of the descriptions in FIGS. 3A to 3C except that the bias voltages $V_1$ and $V_2$ are replaced by bias voltages $V'_1$ and $V'_2$ so that repeated explanations are omitted here.

Figure 9:
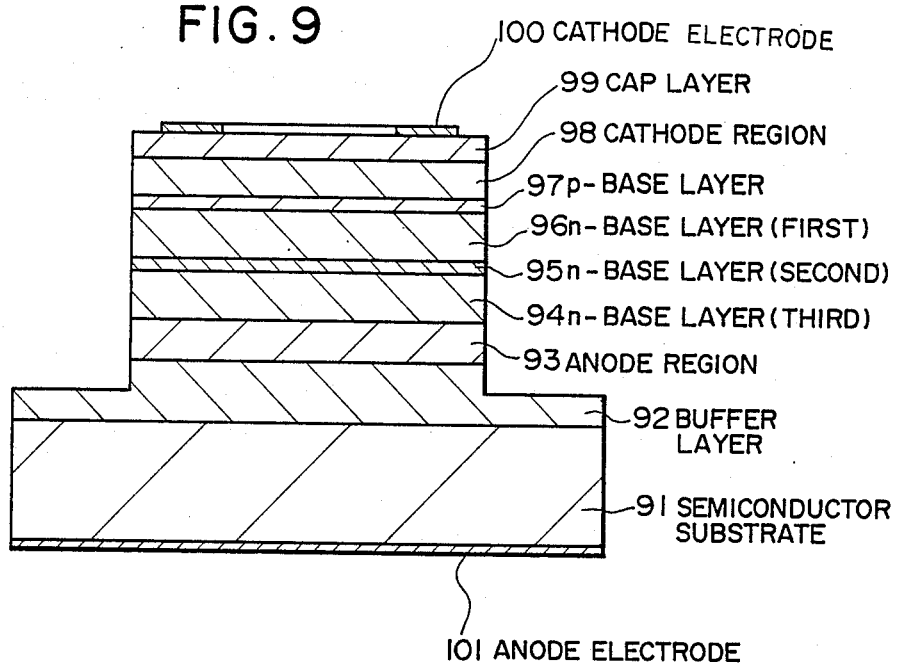
FIG. 9 is a cross sectional view showing a pnpn thyristor in a third embodiment according to the invention.

In FIG. 9, there is shown a pnpn thyristor in the third embodiment according to the invention. The optical pnpn thyristor comprises a semiconductor substrate 91 of p-GaAs, a buffer layer 92 of p-GaAs having a thickness of 0.5 $\mu$m, an anode region 93 of p-Al$_{0.4}$Ga$_{0.6}$As having a thickness of 0.5 $\mu$m and impurity density of $1 \times 10^{18}$ cm$^{-3}$, a first and third n-base layers 96 and 94 each of n-Al$_Z$Ga$_{1-Z}$As (0.25 $\leq Z \leq$ 0.3) having a thickness of 0.5 $\mu$m and impurity density of $5 \times 10^{16}$ cm$^{-3}$, a second n-base layer 95 of n-GaAs having a thickness of 0.1 $\mu$m and impurity density of $5 \times 10^{16}$ cm$^{-3}$, a p-base layer 97 of p-Al$_{0.3}$Ga$_{0.7}$As having a thickness of 0.05 $\mu$m and impurity density of $1 \times 10^{19}$ cm$^{-3}$, a cathode region 98 of n-Al$_{0.4}$Ga$_{0.6}$As having a thickness of 0.3 $\mu$m and impurity density of $1 \times 10^{18}$ cm$^{-3}$, a cap layer 99 of n-GaAs having a thickness of 0.1 $\mu$m and impurity density of $5 \times 10^{18}$ cm$^{-3}$, a cathode electrode 100 of AuGe-Ni, and an anode electrode 101 of AuZn. In the pnpn thyristor, respective forbidden bandwidths of the first to third n-base layers 96, 95 and 94 are narrower than those of the anode and cathode regions 93 and 98, while forbidden bandwidths of the first and third n-base layers 96 and 94 are wider than that of the first n-base layer 95 to be increased in proportion to a distance of the formers from the respective junction planes on the upper and back surfaces of the latter. For this purpose, a value "Z" for defining an impurity density of the first and third n-base layers 96 and 94 is increased linearly from 0.25 up to 0.3 in proportion to the distance as mentioned above.

In FIGS. 10A to 10C, there are shown energy band diagrams in which a zero bias state, high impedance state, and on state are shown for the pnpn thyristor in the third embodiment. As understood from the explanations in conjunction with FIGS. 3A to 3C, each pn junction in the thyristor is placed under a forward bias state as shown in FIG. 10C after the thyristor is turned on. In a case where a base layer is of a single semiconductor layer as in a conventional thyristor, carriers injected into the base layer are diffused thereinto. In the thyristor in the third embodiment, however, carriers are drifted along inclinations of potential because a band structure is formed as shown in FIG. 10C so that the carriers are dropped without any delay into the thin n-base layer 95 effectively. The first to third n-base layers 96, 95 and 94 are deemed in operation to be a single n-base layer having a thickness equal approximately to that of the second n-base layer 95. In a case where a wavelength of trigger light is selected to be smaller than a bandgap wavelength which is determined by a maximum forbidden bandwidth in the n-base layer, an absorption coefficient is not decreased in the structure described above. Further, an external differential quantum efficiency is increased by five percent in the thyristor in which the forbidden band is gradually increased as compared to a thyristor in which n-base layers each of n-Al$_{0.25}$Ga$_{0.75}$As are provided.

Figure 11:
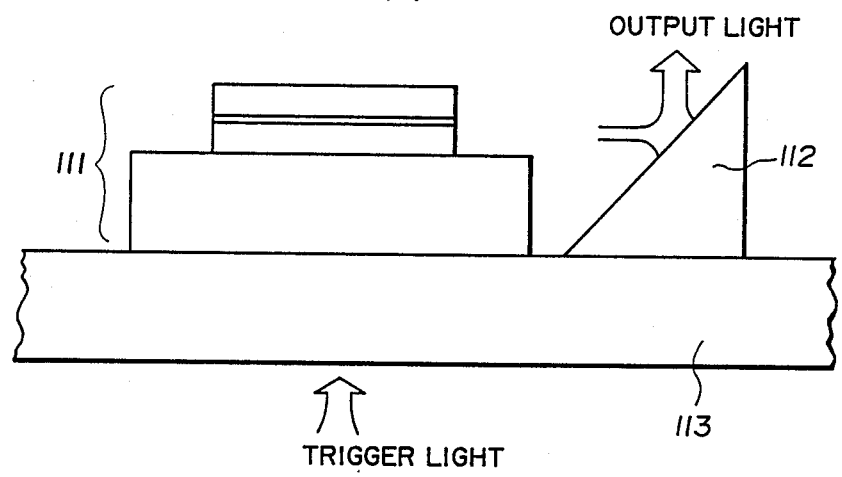
FIG. 11 is a cross sectional view showing a device to which a pnpn thyristor in the first to third embodiments according to the invention is applied.

In FIG. 11, there is shown a device to which a pnpn thyristor in the first to third embodiments according to the invention is applied. The device comprises a thyristor 111 in the embodiments, a forty-five degree reflecting mirror 112, and a plate member 113 having a window (not shown) through which trigger light is passed. The thyristor 111 and forty-five degree reflecting mirror 112 are provided on the plate member 113 wherein the forty-five degree reflecting mirror 112 is formed in an etching process to be positioned near a resonance plane of the thyristor 111.

In operation, a predetermined level of a bias voltage is applied across the thyristor 111, and the trigger light is supplied through the window of the plate member 113 to the thyristor 111 so that output light is radiated in the horizontal direction. The output light thus radiated is reflected in the vertical direction by the forty-five degree reflecting mirror 112. The device is especially useful in an parallel optical information processing means. A reflecting angle of the mirror 112 may be changed to control the direction of output light.

Although the invention has been described with respect to specific embodiment for complete and clear disclosure, the appended claims are not to be thus limited but are to be construed as embodying all modifications and alternative constructions that may occur to one skilled in the art which fairly fall within the basic teaching herein set forth.

What is claimed is:

1. A pnpn thyristor comprising,
   anode and cathode regions, and
   a base region which is positioned between said anode and cathode regions,
   said base region including a p-base layer facing said cathode region, and first to third n-base layers among which said first n-base layer faces said p-base layer, and said third n-base layer faces said anode region,
   wherein respective forbidden bandwidths of said anode and cathode regions are wider than those of said first and third n-base layers, and a forbidden bandwidth of said second n-base layer is narrower than those of said first and third n-base layers.

2. A pnpn thyristor according to claim 1, wherein the forbidden bandwidths of said first to third n-base layers become wider in proportion to a distance from said second n-base layer.

3. A pnpn thyristor comprising,
   a pnpn thyristor element comprising anode and cathode regions, and a base region which is positioned between said anode and cathode regions, said base region including a p-base layer facing said cathode region, and first to third n-base layers among which said first n-base layer faces said p-base layer, and said third n-base layer faces said anode region, wherein respective forbidden bandwidths of said anode and cathode regions are wider than those of said first and third n-base layers, and a forbidden bandwidth of second n-base layer is narrower than those of said first and third n-base layers.
   a mirror having a predetermined reflecting angle which is positioned near a resonance plane of said pnpn thyristor element, and
   a plate member having a window for passing trigger light on which said pnpn thyristor element and said mirror are provided.

4. A pnpn thyristor according to claim 1, in which a thickness of said second n-base layer is approximately 0.1 $\mu$m.

5. A pnpn thyristor according to claim 1, in which thicknesses of said first and third n-base layers are between approximately 0.3 $\mu$m and 0.5 $\mu$m.

6. A pnpn thyristor according to claim 1, in which thicknesses of said first and third n-base layers are approximately 0.3 $\mu$m and 0.5 $\mu$m, respectively.

7. A pnpn thyristor according to claim 1, in which thicknesses of said first and third n-base layers are each approximately 0.5 $\mu$m.

8. A pnpn thyristor according to claim 1, in which thicknesses of said first and third n-base layers are greater than a thickness of said second n-base layer by factors between approximately 3 and 5.

9. A pnpn thyristor according to claim 8, in which thicknesses of said first and third n-base layers are each greater than a thickness of said second n-base layer by a factor of approximately 3 and 5.

10. A pnpn thyristor according to claim 8, in which thicknesses of said first and third n-base layers are greater than a thickness of said second n-base layer by factors of approximately 3 and 5, respectively.

* * * * *

UNITED STATES PATENT AND TRADEMARK OFFICE
CERTIFICATE OF CORRECTION

PATENT NO. : 4,829,357

DATED : May 9, 1989

INVENTOR(S) : Kenichi Kasahara

It is certified that error appears in the above-identified patent and that said Letters Patent is hereby corrected as shown below:

Column 4, line 29, delete "increas" and insert --increase--.

Column 5, line 43, after "current gain in a" insert --transistor consisting of an n-cathode region 22, p-base--.

Signed and Sealed this

Sixteenth Day of January, 1990

Attest:

JEFFREY M. SAMUELS

Attesting Officer     Acting Commissioner of Patents and Trademarks